(12) United States Patent
Yadav et al.

(10) Patent No.: US 7,893,720 B2
(45) Date of Patent: Feb. 22, 2011

(54) BUS LOW VOLTAGE DIFFERENTIAL SIGNALING (BLVDS) CIRCUIT

(75) Inventors: Rajesh Yadav, Ahmedabad (IN);
Vinayak Ashok Ghatawade, Belgaum (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/505,471

(22) Filed: Jul. 18, 2009

(65) Prior Publication Data
US 2011/0012646 A1    Jan. 20, 2011

(51) Int. Cl.
*H03K 19/094* (2006.01)
(52) U.S. Cl. .............................. 326/86; 326/30; 326/26
(58) Field of Classification Search ........................ None
See application file for complete search history.

(56) References Cited
U.S. PATENT DOCUMENTS 6,894,543 B2 * 5/2005 Ho et al. ..................... 327/108
6,977,534 B2 * 12/2005 Radelinow ................... 327/112
7,236,013 B2 * 6/2007 Kasanyal et al. .............. 326/83

* cited by examiner

*Primary Examiner*—Anh Q Tran
(74) *Attorney, Agent, or Firm*—John R. Pessetto; W. James Brady; Frederick J. Telecky, Jr.

(57) ABSTRACT

A differential signaling circuit and a control circuit. The differential signaling circuit includes a first positive driver and a first negative driver. The first negative driver has different impedance than the first positive driver. The first positive driver and the first negative driver together define a first current path between positive and negative power supply terminals. A first output is defined on the first current path intermediate the first positive driver and the first negative driver. The control circuit includes a first driver that drives a transmission line at a first output voltage, a feedback amplifier responsive to the first output voltage to generate a control signal and a metal oxide semiconductor (MOS) driver coupled to the first driver and responsive to the control signal to make impedance of the first driver equivalent to impedance of the transmission line.

8 Claims, 3 Drawing Sheets

US 7,893,720 B2

BUS LOW VOLTAGE DIFFERENTIAL SIGNALING (BLVDS) CIRCUIT

TECHNICAL FIELD

Embodiments of the disclosure relate to bus low voltage differential signaling (BLVDS) circuits.

BACKGROUND

A bus low voltage differential signaling (BLVDS) circuit provides a bus interface circuit based on low voltage differential signaling (LVDS) technology. BLVDS circuits are used in several applications, for example point to point, multi-drop and multi-point applications. Such a BLVDS circuit may be used for data distribution over a printed circuit board that may include circuits operating at different voltage levels. A BLVDS transmitter provides desired output voltages, intermediate positive and negative supply terminals, in response to differential input signals. These output voltages can be obtained across a resistor circuit intermediate the positive and negative supply terminals.

Existing BLVDS circuits are realized using 2.5V (volts) supply. In such BLVDS circuits, 2.5V transistors are operated at 2.5V or 3.3V transistors are under driven at 2.5V. It is desired to operate BLVDS circuits at lower voltages. However, it is difficult to operate the existing BLVDS circuits at lower voltages to meet required frequency targets. Further, there is also a need to achieve common mode voltages as required by BLVDS specifications for the BLVDS circuits operating at the lower voltages.

In light of the foregoing discussion, there is a need of a BLVDS circuit that overcomes the above-mentioned issues.

SUMMARY

Embodiments of the disclosure relate to bus low voltage differential signaling (BLVDS) circuits.

An example of a differential signaling circuit includes a first positive driver and a first negative driver. The first negative driver has different impedance than the first positive driver, and the first positive driver and the first negative driver together defines a first current path between positive and negative power supply terminals. A first output is defined on the first current path intermediate the first positive driver and the first negative driver.

An example of a circuit includes a plurality of drivers defining a current path between positive and negative supply terminals. The circuit also includes a tapped impedance between the plurality of drivers providing a potential indicative of a common mode voltage between the plurality of drivers. Further, the circuit includes a plurality of MOS drivers coupled to the tapped impedance. Moreover, the circuit includes a plurality of feedback amplifiers responsive to the potential to bias the plurality of MOS drivers and thereby urge the potential towards the common mode voltage.

An example of a control circuit includes a first driver that drives a transmission line at a first output voltage. The control circuit also includes a feedback amplifier responsive to the first output voltage to generate a control signal. Further, the control circuit includes a metal oxide semiconductor (MOS) driver coupled to the first driver and responsive to the control signal to make impedance of the first driver equivalent to impedance of the transmission line.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1:
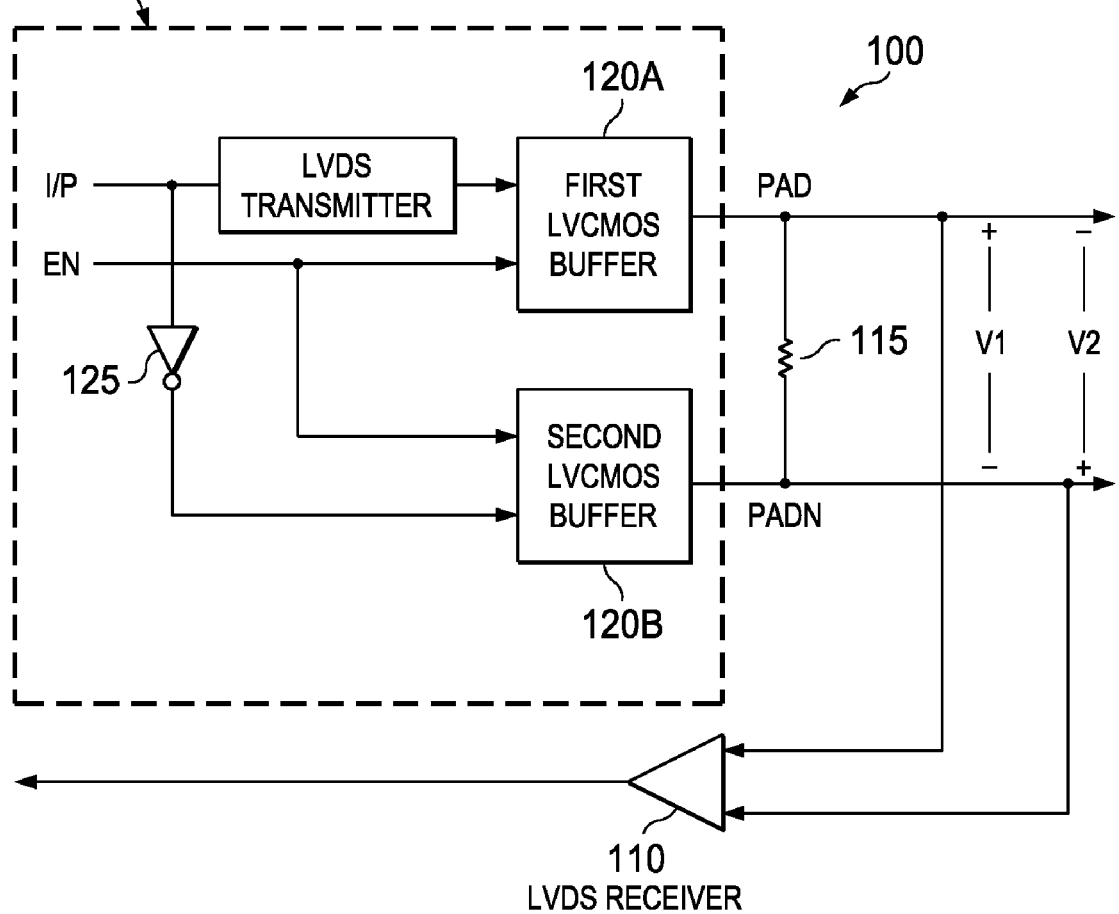
FIG. 1 illustrates a differential signaling circuit, in accordance with one embodiment.

FIG. 1 illustrates a differential signaling circuit, for example a bus low voltage differential signaling (BLVDS) circuit 100. The BLVDS circuit 100 provides a bus interface circuit based on low voltage differential signaling (LVDS) technology and can be implemented in a multi-drop and a multi-point configuration. A multi-drop configuration is a bus topology which includes a single driver or transmitter and multiple receivers. The multi-drop configuration requires only a single termination, present on the opposite end from the transmitter, to prevent signal reflections of a driven signal. A multi-point configuration is another bus topology which includes multiple drivers and multiple receivers. The multi-point configuration requires termination at both ends of the bus as a source can be located anywhere on the bus.

In one aspect, the BLVDS circuit 100 can be referred to as a driver circuit of a bus and can be packaged as an integrated circuit to be used for driving the bus.

The BLVDS circuit 100 includes a low voltage differential signaling (LVDS) transmitter 105, an LVDS receiver 110, and a resistor circuit 115. The LVDS transmitter 105 can include a plurality of low voltage complementary metal oxide semiconductor (LVCMOS) buffers, for example a first LVCMOS buffer 120A and a second LVCMOS buffer 120B. The LVCMOS buffers are responsive to an input signal (UP) to provide desired output signals intermediate the LVCMOS buffers. An enable signal (EN) is also provided to the LVCMOS buffers. The first LVCMOS buffer 120A generates a first output signal PAD in response to the input signal and the enable signal. The second LVCMOS buffer 120B generates a second output signal PADN in response to an inverted input signal and the enable signal. The LVDS transmitter 105 includes an inverter 125 for inverting the input signal for application to the second buffer 120B. PAD and PADN constitute the desired output signals.

In some embodiments, each LVCMOS buffer in the BLVDS circuit 100 is operated at 1.8 volts (V). In some embodiments, the LVDS receiver 110 is a high gain differential receiver also operated at 1.8V. The LVDS receiver 110 receives the two output signals (PAD and PADN) as inputs and detects voltage difference between the two output signals. A voltage output is obtained across the resistor circuit 115. A first output V1 and a second output V2 are opposite in polarity and are obtained in response to differential input signals. In some embodiments, the resistor circuit 115 includes a resistor having impedance equal to 28 ohms. In alternative embodiments, combination of a plurality of resistors can be used. For example, two 56 ohms resistors connected at each end of the bus can be used.

Figure 2:
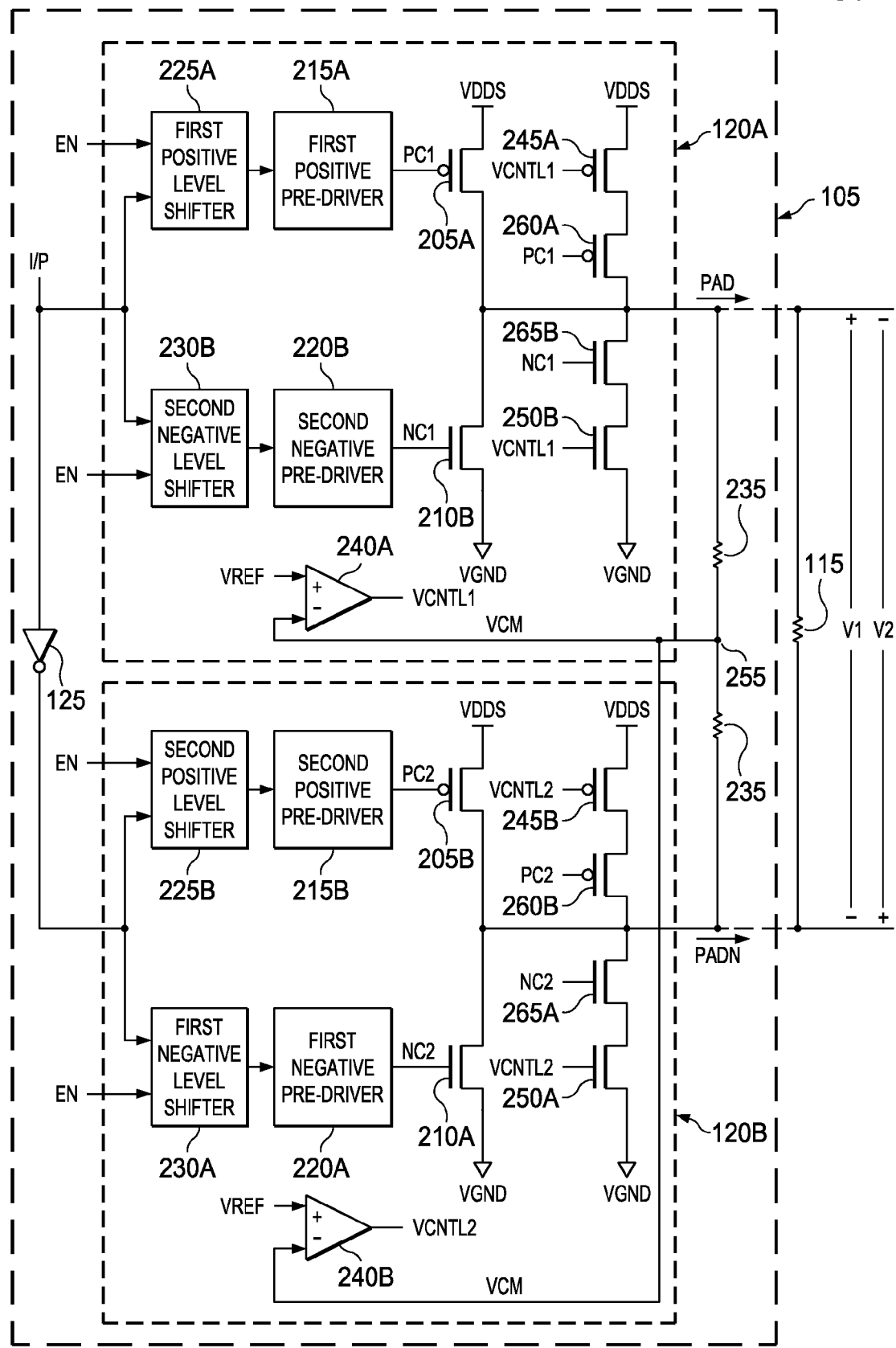
FIG. 2 illustrates a differential signaling transmitter, in accordance with one embodiment.

Referring now to FIG. 2, the LVDS transmitter 105 includes a first LVCMOS buffer 120A and a second LVCMOS buffer 120B. Each LVCMOS buffer includes a plurality of drivers having asymmetrical impedances. Each driver is operable to define a current path in conjunction with an opposing driver of another LVCMOS buffer. The driver and the opposing driver can together be referred to as drivers defining the current path. For example, the first LVCMOS buffer 120A includes a first positive driver 205A and a second negative driver 210B. The second LVCMOS buffer 120B includes a second positive driver 205B and a first negative driver 210A. The first positive driver 205A has different impedance than that of the second negative driver 210B. The second positive driver 205B has impedance similar to that of the first positive driver 205A, and the first negative driver 210A has impedance similar to that of the second negative driver 210B. The first positive driver 205A forms a first current path with the first negative driver 210A through a resistor circuit 115. A first output (V1) is obtained across the resistor circuit 115. The second positive driver 205B forms a second current path with the second negative driver 210B through the resistor circuit 115. A second output (V2) is obtained across the resistor circuit 115. The first output and the second output have opposite polarities. In some embodiments, the magnitude of the first output and the second output is equal.

In some embodiments, the first positive driver 205A forming the first current path with the first negative driver 210A through the resistor circuit 115 to generate the first output constitutes the differential signaling circuit. The differential signaling circuit can also include the second positive driver 205B forming the second current path with the second negative driver 210B through the resistor circuit 115 to generate the second output. In some embodiments, each positive driver is a positive metal oxide semiconductor (PMOS) transistor and each negative driver is a negative metal oxide semiconductor (NMOS) transistor. In alternative embodiments, other circuitry besides PMOS transistors and NMOS transistors can be used for implementing the drivers. In some embodiments, the asymmetrical impedances are achieved by skewing the drivers. The drivers are skewed in order to obtain a desired common mode voltage (VCM). The skewing is referred to as changing a driver dimension, for example channel width and channel length, to increase or decrease impedance. The VCM can be defined as the voltage common to the voltages of the two output signals (PAD and PADN), and can be calculated as average of the magnitudes of the two output signals (PAD and PADN).

Each LVCMOS buffer can further include a plurality of pre-drivers having asymmetrical impedances and coupled to the drivers. Each pre-driver is operable in conjunction with an opposing pre-driver of another LVCMOS buffer to provide differential drive signals to the drivers defining the current path. For example, the first LVCMOS buffer 120A includes a first positive pre-driver 215A coupled to the first positive driver 205A and a second negative pre-driver 220B coupled to the second negative driver 210B. The second LVCMOS buffer 120B includes a second positive pre-driver 215B coupled to the second positive driver 205B and a first negative pre-driver 220A coupled to the first negative driver 210A. The first positive pre-driver 215A and the first negative pre-driver 220A drive the first positive driver 205A and the first negative driver 210A respectively, by providing differential drive signals PC1 and NC2. Similarly, the second positive pre-driver 215B and the second negative pre-driver 220B drive the second positive driver 205B and the second negative driver 210B, respectively by providing differential drive signals PC2 and NC1.

In some embodiments, each pre-driver is a combination of MOS transistors. The pre-drivers are skewed to obtain a particular VCM that is not symmetrical between the positive and negative power supply terminals. Due to asymmetrical impedances of the drivers defining the current path a cross over point of the first output and the second output may be achieved at a voltage not equal to the VCM. The pre-drivers are skewed to have asymmetrical impedances in order to maintain the cross over point of the first output and the second output at the VCM.

Each LVCMOS buffer can also include a plurality of level shifters. For example, the LVCMOS buffer 120A can include a first positive level shifter 225A coupled to the first positive pre-driver 215A and a second negative level shifter 230B coupled to the second negative pre-driver 220B. The second LVCMOS buffer 120B can include a second positive level shifter 225B coupled to the second positive pre-driver 215B and a first negative level shifter 230A coupled to the first negative pre-driver 220A. The level shifters are responsive to input signals to shift levels of the input signals as needed by the pre-drivers.

The LVDS transmitter 105 can also include a control circuit responsive to a potential indicative of the common mode voltage to bias the drivers defining the current path and thereby urge the potential towards the common mode voltage. The potential can be affected by variations in process, voltage and temperature (PVT). The control circuit includes a plurality of MOS drivers coupled to a tapped impedance 235 and a plurality of feedback amplifiers. The feedback amplifiers are responsive to the potential to vary the impedance of the MOS drivers. For example, a first feedback amplifier 240A can vary the impedance of a first PMOS driver 245A, hereinafter referred to as the PMOS driver 245A, and a second feedback amplifier 240B can vary the impedance of a first NMOS driver 250A, hereinafter referred to as the NMOS driver 250A, to urge the potential towards the common mode voltage. The first feedback amplifier 240A can also vary the impedance of a second NMOS driver 250B, hereinafter referred to as the NMOS driver 250B, and the second feedback amplifier 240B can vary the impedance of a second PMOS driver 245B, hereinafter referred to as the PMOS driver 245B, when the second positive driver 205B and the second negative driver 210B are active and hence, forming the second current path. By varying the impedances of the MOS drivers, the overall impedance of the drivers forming the current path can be maintained and thereby the potential can be maintained at the common mode voltage.

Each feedback amplifier receives a reference signal VREF and the common mode voltage signal and produces a voltage control (VCNTL) signal. Each feedback amplifier acts as a comparator and compares two signals to produce the voltage control signal. The VREF can be generated using an internal band gap reference circuit. The common mode voltage signal can be obtained from a node 255 using the tapped impedance 235. The MOS drivers of the first LVCMOS buffer 120A include the PMOS driver 245A with a source connected to the positive power supply and the NMOS driver 250B with a source connected to the negative power supply, both driven by a first voltage control signal (VCNTL1) received from the first feedback amplifier 240A. The MOS drivers of the first LVCMOS buffer 120A can further include a third PMOS driver 260A, hereinafter referred to as the PMOS driver 260A, driven by PC1; and with a drain connected to a drain of the first positive driver 205A and one lead of the tapped impedance 235, and a source connected to a drain of the PMOS driver 245A. The MOS drivers of the first LVCMOS buffer 120A can also include a fourth NMOS driver 265B, hereinafter referred to as the PMOS driver 265B, driven by NC1; and with a drain connected to a drain of the second negative driver 210B and the one lead of the tapped impedance 235, and a source connected to a drain of the NMOS driver 250B. The MOS drivers of the second LVCMOS buffer 120B include the PMOS driver 245B with a source connected to the positive power supply and the NMOS driver 250A with a source connected to the negative power supply, both driven by a second voltage control signal (VCNTL2) received from the second feedback amplifier 240B. The MOS drivers of the second LVCMOS buffer 120B can further include a fourth PMOS driver 260B, hereinafter referred to as the PMOS driver 260B, driven by PC2; and with a drain connected to a drain of the second positive driver 205B and another lead of the tapped impedance 235, and a source connected to a drain of the PMOS driver 245B. The MOS drivers of the second LVCMOS buffer 120B can also include a third NMOS driver 265A, the third NMOS driver 265A hereinafter referred to as the NMOS driver 265A, driven by NC2; and with a drain connected to a drain of the first negative driver 210A and the another lead of the tapped impedance 235, and a source connected to a drain of the NMOS driver 250A.

In some embodiments, the tapped impedance 235 includes two resistors connected in series between the first LVCMOS buffer 120A and the second LVCMOS buffer 120B. Each resistor may have a value of 10,000 ohms.

The working of the LVDS transmitter 105 is explained as follows: When UP and EN are at logic level LO, PC1 is a positive voltage terminal (VDDS) signal at logic level HI, and the first positive driver 205A and the PMOS driver 260A are inactive. NC1 is also a VDDS signal at logic level HI, and the second negative driver 210B and the NMOS driver 265B are active. PC2 is a negative voltage terminal (VGND) signal at logic level LO, and the second positive driver 205B and the PMOS driver 260B are active. NC2 is also a VGND signal at logic level LO, and the first negative driver 210A and the NMOS driver 265A are inactive. Therefore, the second current path between VDDS and VGND is through the second positive driver 205B, the PMOS driver 260B, the resistor circuit 115, the second negative driver 210B, and the NMOS driver 265B.

In some embodiments, the LVCMOS buffers are operated at 1.8V. The VDDS is equal to 1.8V. Each positive driver is skewed to have an impedance of 28 ohms and each negative driver is skewed to have an impedance of 72 ohms. The resistor circuit 115 has total impedance of 28 ohms. The current value is 14 milliamps (mA). The current in the second current path flows from VDDS terminal through second positive driver 205B, the resistor circuit 115, and the second negative driver 210B. In some embodiments, the current in the second current path also flows through the PMOS driver 260B, the PMOS driver 245B, the NMOS driver 265B, and the NMOS driver 250B. The voltage of PAD signal (VPAD) is 1.0V [14 mA*72 ohms]. The voltage of PADN (VPADN) signal is 1.4V [14 mA*(72+28) ohms]. The second output is negative and has magnitude of 400 mV (VPAD−VPADN=1.0V−1.4V). The VCM value is 1.2V [(VPAD+VPADN)/2=(1.0+1.4)/2].

The VCM value might differ due to PVT variation. If the VCM value goes less than 1.2V, then output VCNTL1 of the first feedback amplifier 240A lowers down the gate voltage (VGS) of the NMOS driver 250B to increase impedance of the NMOS driver 250B and thereby maintains overall impedance of the second negative driver 210B at 72 ohms. Further, the output of the second feedback amplifier 240B VCNTL2, increases the VGS of the PMOS driver 245B to decrease impedance of the PMOS driver 245B and thereby maintains overall impedance of the second positive driver 205B at 28 ohms. Therefore, effective pull down strength becomes weak and effective pull up strength becomes strong and the VCM is pulled up to 1.2V thereby making the VCM independent of PVT variations.

If the VCM is greater than 1.2V, then the output of the first feedback amplifier 240A, VCNTL1, increases the VGS of the NMOS driver 250B to decrease impedance of the NMOS driver 250B and thereby maintains overall impedance of the second negative driver 210B at 72 ohms. Further, the output of the second feedback amplifier 240B, VCNTL2, decreases the VGS of the PMOS driver 245B to increase impedance of the PMOS driver 245B and thereby maintains overall impedance of the second positive driver 205B at 28 ohms. Therefore, effective pull down strength becomes strong and effective pull up strength becomes weak and the VCM is pulled down to 1.2V.

The feedback amplifiers receive the VCM and the VREF as inputs. The VCM is obtained through the node 255 using the tapped impedance 235. If magnitude of the desired VCM is 1.2V, the VREF with magnitude of 1.2V is generated using the internal band gap reference circuit. Each feedback amplifier compares magnitude of the VCM with the VREF and generates the voltage control signal. The voltage control signal is used to control the drive strength of the each LVCMOS buffer.

When I/P is at logic level HI and EN is at logic level LO, PC1 is the VGND signal at logic level LO, and the first positive driver 205A and the PMOS driver 260A are active. NC1 is also a VGND signal at logic level LO, and the second negative driver 210B and the NMOS driver 265B are inactive. PC2 is the VDDS signal at logic level HI, and the second positive driver 205B and the PMOS driver 260B are inactive. NC2 is also a VDDS signal at logic level HI, and the first negative driver 210A and the NMOS driver 265A are active. Therefore, the first current path between VDDS and VGND is through the first positive driver 205A, the PMOS driver 260A, the resistor circuit 115, the first negative driver 210A, and the NMOS driver 265A.

In some embodiments, the LVCMOS buffers are operated at 1.8V. The VDDS is equal to 1.8V. Each positive driver is skewed to have an impedance of 28 ohms and each negative driver is skewed to have an impedance of 72 ohms. The resistor circuit 115 has total impedance of 28 ohms. The current value is 14 milliamps (mA). The current in the first current path flows from VDDS terminal through first positive driver 205A, the resistor circuit 115, and the first negative driver 210A. In some embodiments, the current in the first current path also flows through the PMOS driver 245A, the PMOS driver 260A, the NMOS driver 265A, and the NMOS driver 250A. The voltage of PAD signal (VPAD) is 1.4V [14 mA*(72+28) ohms]. The voltage of PADN (VPADN) signal is 1.0V [14 mA*72 ohms]. The first output is positive and has magnitude of 400 mV (VPAD−VPADN=1.4V−1.0V). The VCM value is 1.2V [(VPAD+VPADN)/2=(1.4+1.0)/2].

The VCM control for I/P at logic level HI and EN at logic level LO is same as explained above when the I/P and EN inputs are at logic level LO. In some embodiments, when EN is at logic level HI, the BLVDS circuit is inactive.

In some embodiments, based on different applications, different VCM might be desired for 1.8V. In order to achieve the desired VCM, the positive and negative drivers can be skewed to obtain appropriate impedances. The impedances of the positive and negative drivers can be determined based on the desired VCM and 1.8V. The impedance of the positive driver for a current of 15 mA can be calculated as [(1.8V−VPAD)/15 mA]. Similarly, the impedance of the negative driver can be calculated as [(VPADN−0V)/15 mA]. In some embodiments, the BLVDS circuit can be operated at various other voltages, for example 5V and 3.3V. The desired VCM can also be maintained by skewing the positive and negative drivers. The impedances of the positive and negative drivers can be determined based on the desired voltage and the desired VCM. For example, it is desired to operate the BLVDS circuit at 1.5V and to obtain a VCM of 1V. For a current of 15 mA, and VPAD and VPADN as 1.2V and 0.8V respectively, impedance of the positive driver can be calculated as 20 ohms [(1.5V−1.2V)/15 mA]. Similarly, the impedance of the negative driver can be calculated as 53 ohms [(0.8V−0V)/15 mA]. In some embodiments, the control circuit can also be used in the BLVDS circuit having symmetrical impedances for the drivers defining the current path.

Figure 3:
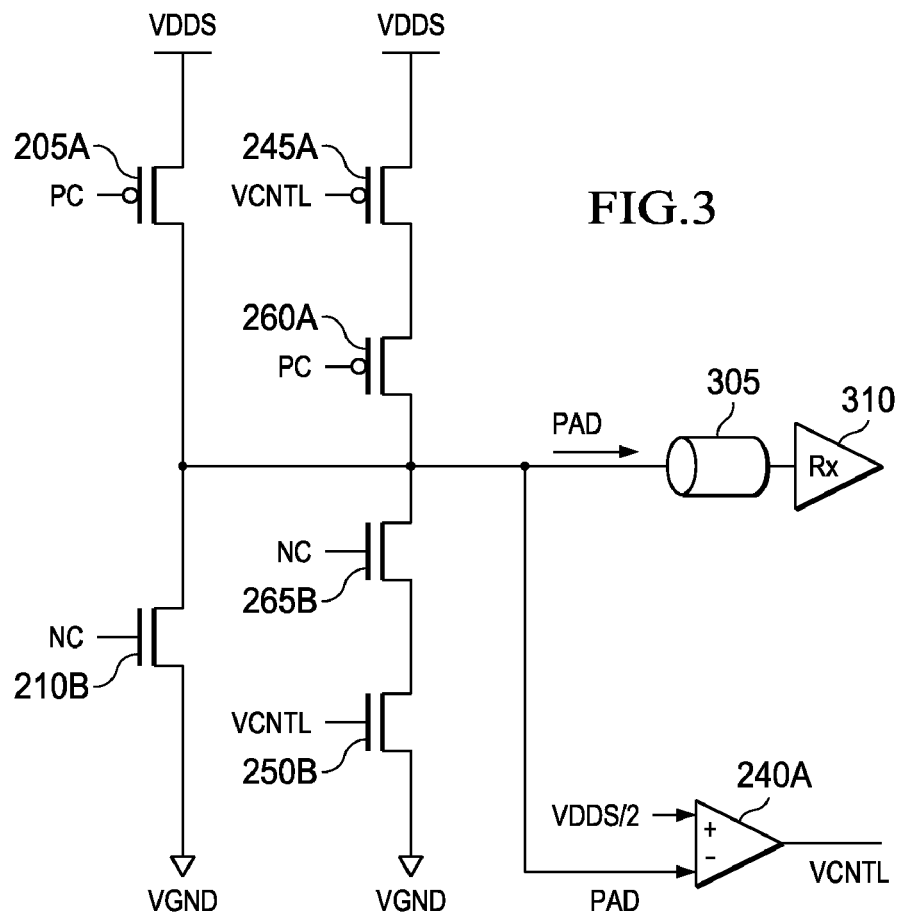
FIG. 3 illustrates a control circuit for adaptive impedance control, in accordance with one embodiment.

The control circuit can be used for various other purposes, for example for adaptive impedance control as explained in conjunction with FIG. 3.

FIG. 3 illustrates a control circuit for adaptive impedance control. The control circuit includes a first driver, for example the first positive driver 205A, and a second driver, for example the second negative driver 210B. The first driver drives a transmission line 305 at a first output voltage and the second driver drives the transmission line 305 at a second output voltage. The transmission line is further connected to a receiver (Rx) 310. The first output voltage and the second output voltage are opposite in polarity. A plurality of MOS drivers are coupled to the first positive driver 205A and the second negative driver 210B, for example the PMOS driver 245A and PMOS driver 260A are coupled to the first positive driver 205A, and the NMOS driver 265B and the NMOS driver 250B are coupled to the second negative driver 210B. The MOS drivers provide parallel pull-up and pull-down paths.

The control circuit also includes the feedback amplifier 240A that generates control signals in response to the first output voltage or the second output voltage. The impedance of the PMOS driver 245A coupled to the first driver and of the NMOS driver 250B coupled to the second driver can be varied based on the control signals. For example, if the output of the transmission line 305 is at the first output voltage then the first output voltage and a voltage equivalent to half of the magnitude of the positive supply voltage (VDDS) are provided to the feedback amplifier 240A. The feedback amplifier 240A compares a VDDS/2 and the first output voltage to generate a control signal (VCNTL). The control signal varies the impedance of the PMOS driver 245A by varying gate voltage and thereby makes the effective impedance of the first driver equivalent to the impedance of the transmission line 305. In another example, if the output of the transmission line 305 is at the second output voltage then the second output voltage and a voltage equivalent to half of the magnitude of the positive supply voltage (VDDS) are provided to the feedback amplifier 240A. The feedback amplifier 240A compares the VDDS/2 and the second output voltage to generate the control signal (output of the feedback amplifier 240A) with opposite polarity to that of the control signal generated in response to the first output voltage. The control signal with the opposite polarity varies the impedance of the NMOS 250B and thereby makes the effective impedance of the second driver equivalent to the impedance of the transmission line. The impedances of the PMOS driver 245A and the NMOS driver 250B can be selectively varied using the control signals of the opposite polarity. The control signals of the opposite polarity are generated in response to the first output voltage and the second output voltage.

The impedance of the transmission line and that of the first driver or the second driver may mismatch due to PVT variations. For example, when the impedance of the first driver is 70 ohms the impedance of the transmission line 305 can be 50 ohms, for a particular PVT. The voltage of the output signal, for example PAD is 0.41*VDDS [(50/(50+70))*VDDS]. The impedance of the PMOS driver 245A can then be pulled-up to make the effective impedance of the first driver as 50 ohms. In case, the impedance of the transmission line 305 falls down to 40 ohms then the impedance of the PMOS driver 245A can then be varied to make the effective impedance of the first driver as 40 ohms. Working for varying impedance of the NMOS driver 250B is similar to that of the PMOS driver 245A. The control circuit can be referred to as an adaptive impedance control circuit, since the control circuit adapts the impedance of the first driver or the second driver to the impedance of the transmission line 305.

It will be appreciated that the signals, for example PC and NC can be generated using various circuits, for example pre-drivers and level shifters as shown in FIG. 2.

The control circuit can be used for adaptive impedance control in one or more different applications, for example in bus circuits.

Figure 4:
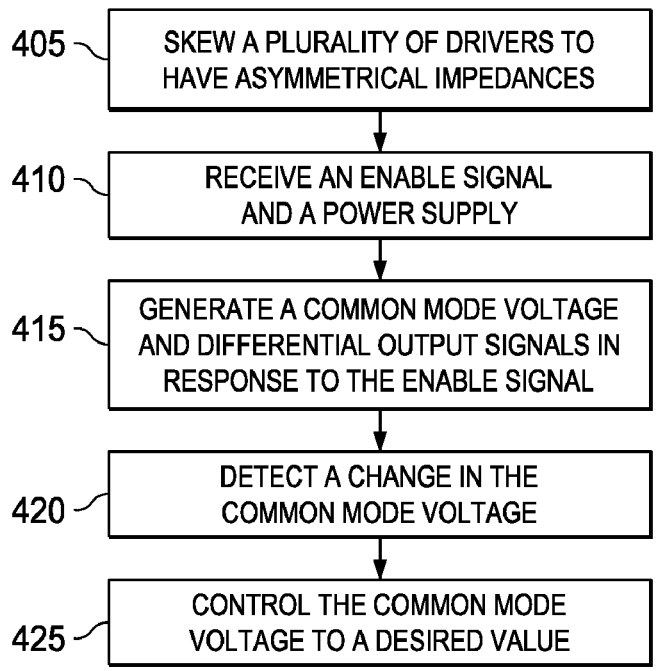
FIG. 4 is a flow diagram illustrating a method for generating differential signals, in accordance with one embodiment.

FIG. 4 is a flowchart illustrating a method for generating differential signals.

At step 405, a plurality of drivers are skewed to have asymmetrical impedances. The impedance values can be determined based on desired voltage for a process and a desired common mode voltage. For example, a positive driver can be skewed to have an impedance of 28 ohms and a negative driver can be skewed to have an impedance of 72 ohms for a 1.8V process and 1.2V common mode voltage. The drivers with asymmetrical impedances can be packaged as an integrated circuit to constitute a BLVDS circuit or a driver circuit for driving the bus.

At step 410, an enable signal and a power supply is received. The enable signal is input to the BLVDS circuit along with another input signal. At step 415, the common mode voltage and the differential output signals are generated. The input signals can be shifted to desired levels and can be fed to pre-drivers to generate driving signals for the drivers. The drivers (one positive and one negative) then operate in response to the enable signal and the power supply to define a current path between the positive and negative power supply. An output voltage is obtained on the current path intermediate the drivers. In some embodiments, two sets of such drivers can be present and hence, two output voltages which are equal in magnitude but have opposite polarity can be obtained.

At step 420, a change is detected in the common mode voltage. Due to PVT variations, the common mode voltage can change to different values. The change can be detected using tapped impedance which can be placed between the drivers.

At step 425, the common mode voltage is controlled to a desired value. The common mode voltage can be compared with a reference voltage to generate a control signal. The control signal can then be used to bias the drivers defining the current path and thereby bringing the common mode voltage to the desired value.

In the foregoing discussion, the term "coupled or connected" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the present disclosure, and that such modifications, alterations, and combinations are to be viewed as being within the ambit of the inventive concept.

The foregoing description sets forth numerous specific details to convey a thorough understanding of embodiments of the present disclosure. However, it will be apparent to one skilled in the art that embodiments of the present disclosure may be practiced without these specific details. Some well-known features are not described in detail in order to avoid obscuring the present disclosure. Other variations and embodiments are possible in light of above teachings, and it is thus intended that the scope of present disclosure not be limited by this Detailed Description, but only by the Claims.

What is claimed is:

1. A differential signaling circuit comprising:
   a first positive driver;
   a first negative driver, the first negative driver having different impedance than the first positive driver, the first positive driver and the first negative driver together defining a first current path between positive and negative power supply terminals, a first output being defined on the first current path intermediate the first positive driver and the first negative driver;
   a second positive driver, the second positive driver having an impedance similar to that of the first positive driver;
   a second negative driver, the second negative driver having an impedance similar to that of the first negative driver, the second positive driver and the second negative driver together defining a second current path between the positive and negative power supply terminals, a second output being defined on the second current path intermediate the second positive driver and the second negative driver;
   a plurality of pre-drivers responsive to input signals to provide differential drive signals to positive and negative drivers defining a current path; and
   a plurality of level shifters responsive to the input signals to shift levels of the input signals to desired levels;
   wherein the plurality of pre-drivers have asymmetrical impedances to maintain a cross over point of the first output and the second output.

2. The differential signaling circuit of claim 1, wherein the first positive driver and the second negative driver are comprised in a low voltage complementary metal oxide semiconductor (LVCMOS) buffer.

3. The differential signaling circuit of claim 1, wherein the second positive driver and the first negative driver are comprised in a low voltage complementary metal oxide semiconductor (LVCMOS) buffer.

4. The differential signaling circuit of claim 1, wherein each driver is operated at 1.8 volts.

5. The differential signaling circuit of claim 1, wherein each positive driver comprises a p-type metal oxide semiconductor (PMOS) transistor and each negative driver comprises a n-type metal oxide semiconductor (NMOS) transistor.

6. The differential signaling circuit of claim 1 further comprising:
   a tapped impedance between the positive and negative drivers defining the current path, the tapped impedance providing a potential indicative of a common mode voltage between the positive and negative drivers.

7. The differential signaling circuit of claim 6 further comprising:
   a control circuit responsive to the potential to urge the potential towards the common mode voltage.

8. The differential signaling circuit of claim 7, wherein the control circuit comprises:
   a plurality of MOS drivers; and
   a plurality of feedback amplifiers responsive to the potential to bias the plurality of MOS drivers.

* * * * *